United States Patent
Schauer et al.

(10) Patent No.: US 7,285,483 B2
(45) Date of Patent: *Oct. 23, 2007

(54) COATED SEMICONDUCTOR WAFER, AND PROCESS AND APPARATUS FOR PRODUCING THE SEMICONDUCTOR WAFER

(75) Inventors: Reinhard Schauer, Laufen (DE); Norbert Werner, Tengling (DE)

(73) Assignee: Silitronic AG, Munich (DE)

( * ) Notice: Subject to any disclaimer, the term of this patent is extended or adjusted under 35 U.S.C. 154(b) by 0 days.

This patent is subject to a terminal disclaimer.

(21) Appl. No.: 11/283,272

(22) Filed: Nov. 18, 2005

(65) Prior Publication Data

US 2006/0079089 A1    Apr. 13, 2006

Related U.S. Application Data

(63) Continuation-in-part of application No. 10/854,649, filed on May 26, 2004, now Pat. No. 7,101,794.

(30) Foreign Application Priority Data

Jun. 26, 2003  (DE) ................................. 103 28 842
Dec. 16, 2004  (DE) ..................... 10 2004 060 625

(51) Int. Cl.
 *H01L 21/20*  (2006.01)
(52) U.S. Cl. ............................... 438/584; 257/E21.128; 257/618; 118/732
(58) Field of Classification Search ................ 438/758, 438/584, 789, 790, 680; 257/E21.128, 618, 257/E23.117; 118/732
See application file for complete search history.

(56) References Cited

U.S. PATENT DOCUMENTS

| 3,549,847 | A | 12/1970 | Clark et al. |
| 6,129,047 | A | 10/2000 | Nakamura |
| 2001/0003620 | A1* | 6/2001 | Dubots et al. ............... 428/446 |
| 2001/0037761 | A1* | 11/2001 | Ries et al. .................. 117/200 |
| 2003/0041799 | A1* | 3/2003 | Yang et al. ................. 117/200 |
| 2004/0266181 | A1 | 12/2004 | Schauer et al. |

FOREIGN PATENT DOCUMENTS

| DE | 103 28 842 A1 | 1/2005 |
| JP | 60-254610 | 12/1985 |
| JP | 01264969 A | * 10/1989 |

OTHER PUBLICATIONS

A. Heinzel & F. Mahlendorf, submission to the second forum on Industrial Property Research in North Rhine-Westphalia, Gelsenkirchen, Feb. 12, 2003.
Patent Abstract of Japan corresponding to JP 60-254610.

* cited by examiner

Primary Examiner—Caridad M. Everhart
(74) Attorney, Agent, or Firm—Brooks Kushman P.C.

(57) ABSTRACT

A susceptor configured to receive a semiconductor wafer for deposition of a layer on a front surface of the semiconductor wafer by chemical vapor deposition (CVD) has a gas-permeable structure with a porosity of at least 15%, a density of from 0.5 to 1.5 g/cm$^3$, a pore diameter of less than 0.1 mm and an internal surface area of the pores which is greater than 10,000 cm$^2$/cm$^3$. Semiconductor wafers having front surface coated by chemical vapor deposition (CVD) and a polished or etched back surface, prepared using the gas-permeable susceptor, have a nanotopography of the back surface, expressed as the PV (=peak to valley) height fluctuation, of less than 5 nm, and at the same time the halo of the back surface, expressed as haze, is less than 5 ppm.

7 Claims, 4 Drawing Sheets

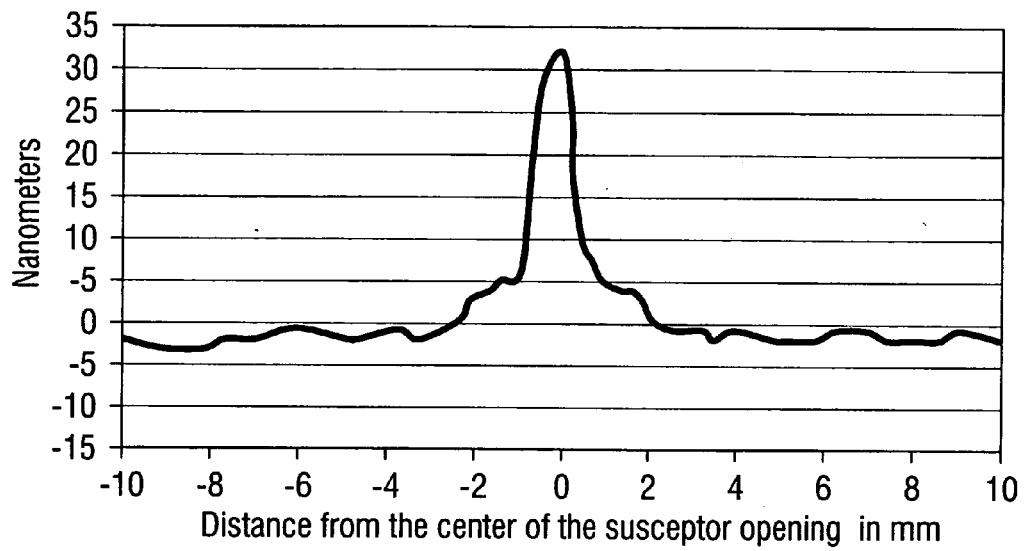
Fig. 5  Nanotopography of the wafer back surface for hole diameters of 0.5 mm
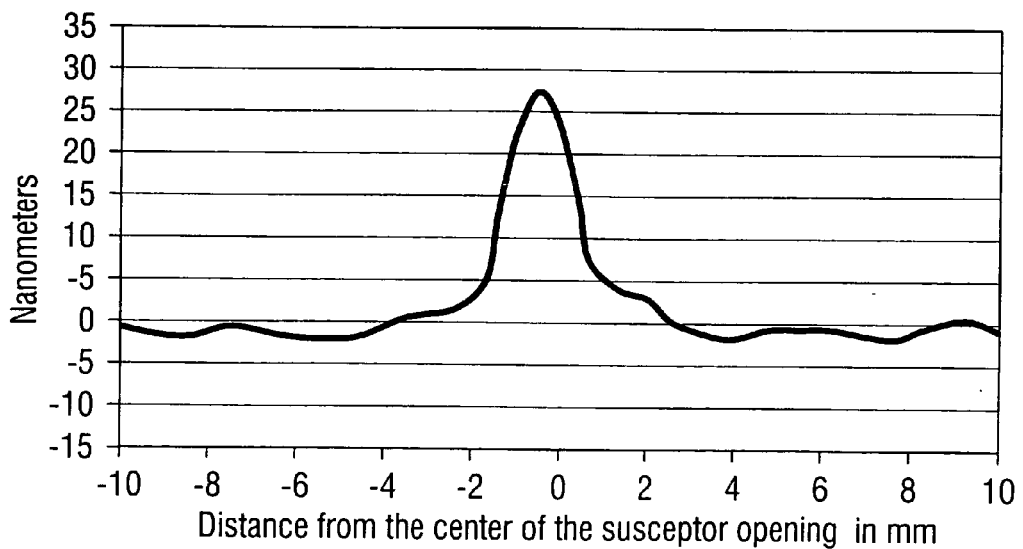
Fig. 6  Nanotopography of the wafer back surface for hole diameters of 1.0 mm

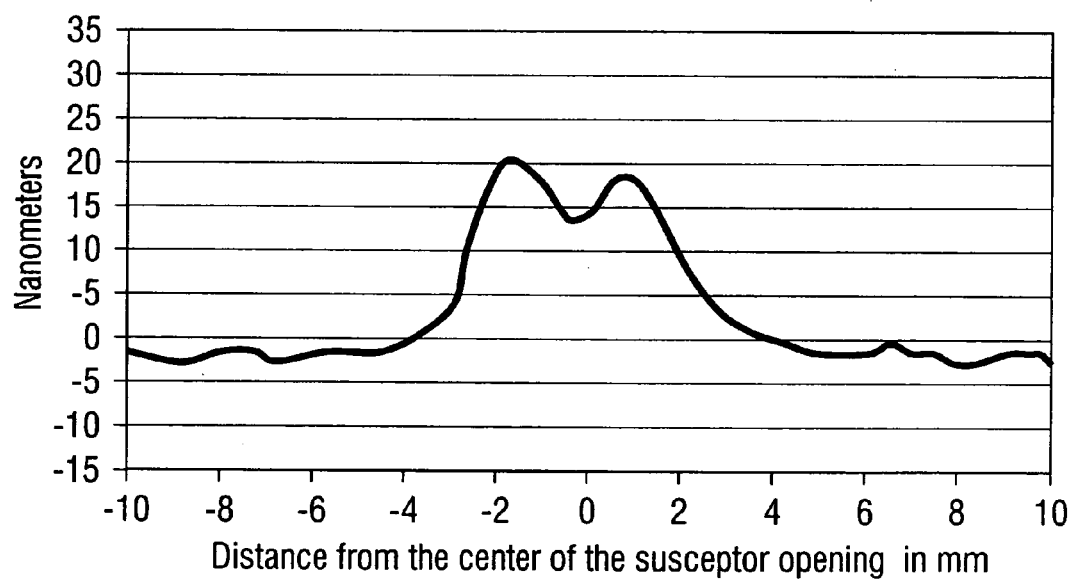
Fig. 7 Nanotopography of the wafer back surface for hole diameters of 1.5 mm

COATED SEMICONDUCTOR WAFER, AND PROCESS AND APPARATUS FOR PRODUCING THE SEMICONDUCTOR WAFER

CROSS-REFERENCE TO RELATED APPLICATIONS

This application is a continuation-in-part and claims priority to U.S. application Ser. No. 10/854,649 filed May 26, 2004 now U.S. Pat. No. 7,101,794, and to German Application Nos. DE 103 28 842.2 filed Jun. 26, 2003 and DE 10 2004 060 625.0 filed Dec. 16, 2004.

BACKGROUND OF THE INVENTION

1. Field of the Invention

The invention relates to a semiconductor wafer having a back surface and a front surface which has been coated by chemical vapor deposition (CVD) and a polished or etched back surface, and to a process for producing the semiconductor wafer. The invention also relates to a susceptor for a semiconductor wafer to be placed on during the deposition of a layer on a front surface of the semiconductor wafer by chemical vapor deposition (CVD).

2. Background Art

Chemical vapor deposition (CVD), in particular deposition of an epitaxial layer on a silicon substrate wafer which has been polished on both sides, involves, inter alia, confronting two phenomena known as "autodoping" and "halo". In the case of autodoping, dopants pass from the back surface of the semiconductor wafer via the vapor phase into the deposition gas which is passed over the front surface of the semiconductor wafer. They are then incorporated in the epitaxial layer predominantly in the edge region of the front surface of the semiconductor wafer and as a result cause a more or less pronounced undesirable radial fluctuation in the resistivity of the epitaxial layer.

The term halo denotes a scattered-light effect which is caused by light-scattering structures on the back surface of the semiconductor wafer and manifests itself when the back surface of the semiconductor wafer is exposed to a focused light beam. The structures mark transitions on the back surface of the semiconductor wafer at which regions with a native oxide layer adjoin regions where an oxide layer of this type is not present. The transitions, which are likewise undesirable, occur if the removal of the native oxide layer during a preheating phase known as the "prebake", prior to the actual deposition phase, was incomplete. One way of quantifying the halo effect is a scattered-light measurement of the haze, for example using a Tencor SP1 appliance in what is known as the DNN (DarkField Narrow Normal) or DWN (DarkField Wide Normal) channel.

To avoid problems with autodoping, it is proposed in U.S. Pat. No. 6,129,047 to provide slots in the base of the pocket in the susceptor which receives the semiconductor wafer, the slots being arranged at the outer edge of the base. Dopants which diffuse out from the back surface of the semiconductor wafer can be removed from the reactor by purge gas which is passed through slots in the susceptor onto the back surface of the wafer without reaching the front surface of the semiconductor wafer. According to US 2001/0037761 A1, small holes are provided throughout the entire base of the susceptor for the same purpose. In this case too, the dopant which diffuses out from the back surface of the semiconductor wafer is carried away by the passage of a purge gas. The measures are also effective at preventing halo formation, since they facilitate the removal of the native oxide layer, since gaseous reaction products which are formed during the dissolution of the native oxide are likewise transported away through the holes in the base and the purge gas flowing past.

However, the use of the susceptor described is not altogether without problems, since the holes influence the temperature field on the back surface and front surface of the semiconductor wafer. If the diameter of the holes in the base of the susceptor exceeds a certain size, this has an adverse effect on the nanotopography of the front surface of the semiconductor wafer. The term nanotopography is used to describe height fluctuations in the nanometer range, measured over a lateral range from 0.5 to 10 mm. The temperature fluctuations caused by the holes lead to locally different deposition rates during deposition of the epitaxial layer on the front surface of the semiconductor wafer and ultimately to the abovementioned height fluctuations. To avoid this problem, in US-2001/0037761 A1, it is proposed that the diameter of the holes be restricted and that the temperature field be made more even by adapting the power of the lamp heating. However, these measures are only effective with regard to the front surface of the semiconductor wafer. As the inventors of the present invention have discovered, the nanotopography values on the back surface of the semiconductor wafer become even worse with decreasing diameter of the holes in the susceptor. On account of the presence of the holes, the temperature field on the back surface of the semiconductor wafer remains so uneven that local etching caused by purge gas, for example hydrogen, and local deposition, caused by deposition gas reaching the back surface of the semiconductor wafer, both occur. Each have a deleterious effect on the nanotopography of the back surface, which cannot be tolerated since even unevenness on the back surface of the semiconductor wafer may cause focusing problems for the stepper during the production of electronic components on the front surface of the semiconductor wafer.

SUMMARY OF THE INVENTION

Therefore, the object of the present invention is to provide a process wherein autodoping, halo, and disadvantageous nanotopography of the front surface and back surface of wafers undergoing CVD deposition can be minimized, to provide a susceptor useful for this purpose, and to provide CVD-coated semiconductor wafers with especially low nanotopology values on the back surface thereof.

BRIEF DESCRIPTION OF THE DRAWINGS

FIG. 5 illustrates the nanotopology of an epitaxially coated wafer wherein a prior art susceptor having a hole diameter of 0.5 mm is employed during CVD.

FIG. 6 illustrates the nanotopology of an epitaxially coated wafer wherein a prior art susceptor having a hole diameter of 1.0 mm is employed during CVD.

FIG. 7 illustrates the nanotopology of an epitaxially coated wafer wherein a prior art susceptor having a hole diameter of 1.5 mm is employed during CVD.

DETAILED DESCRIPTION OF THE PREFERRED EMBODIMENT(S)

Figure 1:
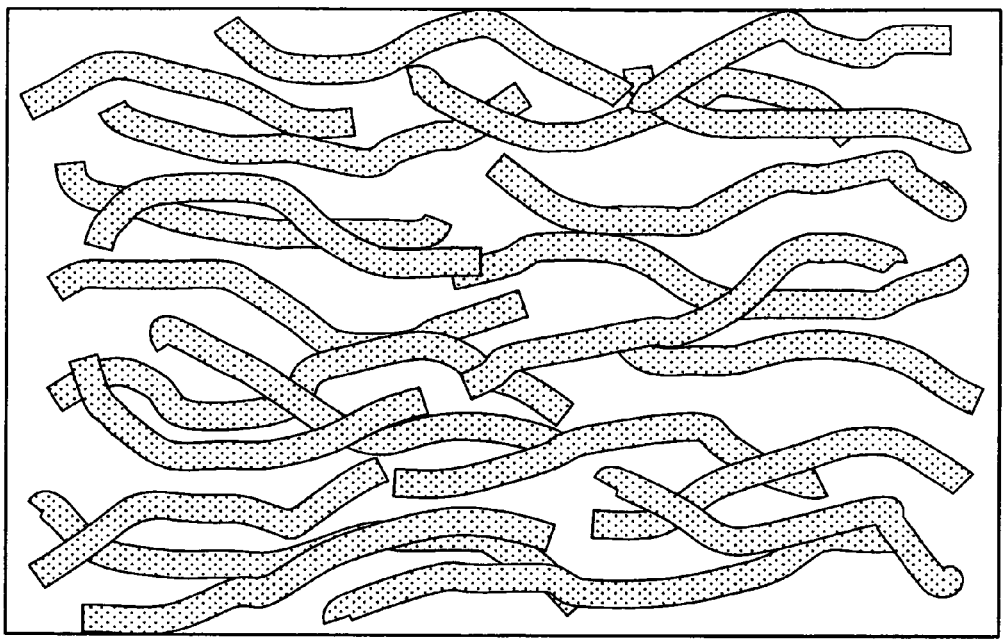
FIG. 1 diagrammatically depicts a sectional illustration of one embodiment of a susceptor according to the invention, with a fiber structure.
Figure 2:
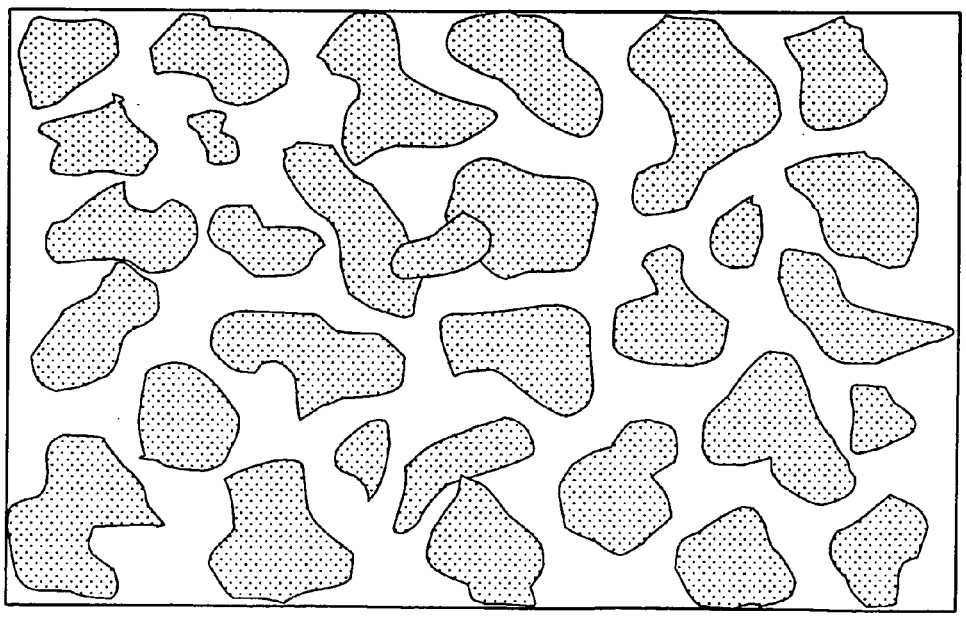
FIG. 2 shows, in the same form of illustration, a further embodiment of a susceptor according to the invention, with a particle structure.
Figure 3:
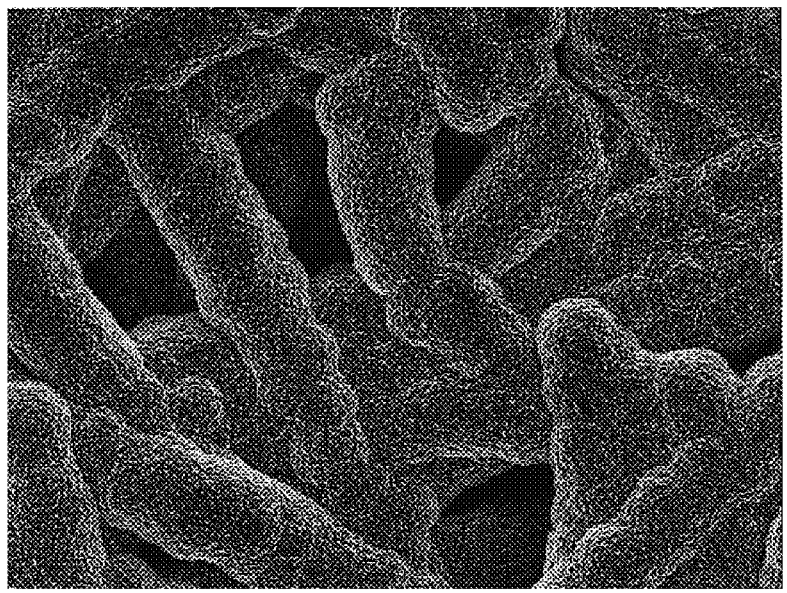
FIG. 3 shows a plan view (as seen perpendicular to the surface) of one example of a susceptor according to the invention consisting of graphite fibers. The pores in the surface are clearly apparent.
Figure 4:
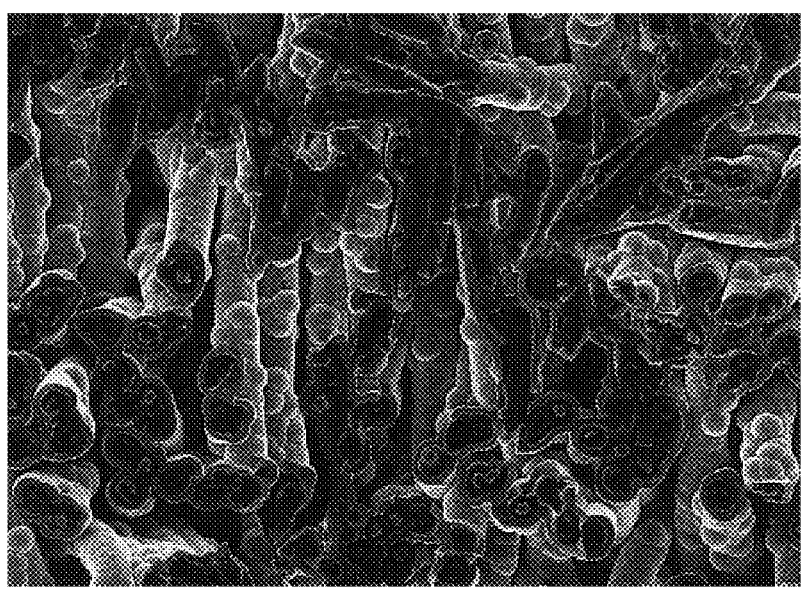
FIG. 4 shows a cross section through the same susceptor as shown in FIG. 3. Once again, the individual graphite fibers and pores in the susceptor can be recognized.

The subject matter of the invention is a semiconductor wafer having a front surface which has been coated by chemical vapor deposition (CVD) and a polished or etched back surface, wherein the nanotopography of the back surface, expressed as the PV (=peak to valley) height fluctuation, is less than 5 nm, and at the same time the halo of the back surface, expressed as haze, is less than 5 ppm.

The semiconductor wafer is preferably a silicon substrate wafer with an epitaxially deposited layer on the front surface. The back surface of the coated semiconductor wafer is polished or etched. The substrate wafer is preferably p-doped or n-doped, more preferably p-doped with boron as dopant, in which case the doping level may be $p^-$, p, $p^+$ and $p^{++}$. A doping level $p^+$, which corresponds to a resistivity of approximately 0.005 to approximately 0.03 ohm·cm, is particularly preferred. The epitaxial layer is preferably likewise p-doped, most preferably with boron as dopant, and preferably has a doping level p, which corresponds to a resistivity of approximately 1 to approximately 20 ohm·cm. The thickness of the epitaxial layer is preferably from 0.1 μm to 100 μm, depending primarily on the intended use. The nanotopography of the front surface of the coated semiconductor wafer, based on square measurement sites with a standard surface area of 0.5 mm·0.5 mm, 2 mm·2 mm or 10 mm·10 mm, is preferably less than 10 nm, more preferably less than 5 nm. The nanotopography of the back surface of the semiconductor wafer is less than 5 nm, preferably based on a measurement window with a surface area of 10 mm·10 mm.

The subject matter of the invention is also a process for producing a semiconductor wafer having a layer deposited on a front surface by chemical vapor deposition (CVD) and a polished or etched back surface, the semiconductor wafer, for deposition of the layer, being placed on a susceptor, so that the back surface of the semiconductor wafer faces a base of the susceptor, wherein gaseous substances pass through the susceptor through gas diffusion from the back surface of the semiconductor wafer into a region above the back surface of the susceptor.

The process differs from known processes in particular by virtue of the use of a susceptor with a porous structure having a small pore diameter and large internal surface area of the pores. As a result, the gas is transported by diffusion rather than in the form of a directional gas flow, as is the case when using perforated susceptors. Membranes made from graphite felt are used, for example, albeit completely in a different context, in the construction of fuel cells, and in that application are used as diffusion layers (cf. for example A. Heinzel & F. Mahlendorf, submission to the second forum on Industrial Property Research in North Rhine-Westphalia, Gelsenkirchen, on Feb. 12, 2003). The porous susceptor prevents the formation of flow inhomogeneities in the vicinity of the wafer back surface and minimizes the nanotopography effects described above. Moreover, the temperature distribution on the wafer back and front surfaces is homogenized. The reason for this is the fact that the porous susceptor described here, unlike perforated susceptors, has a very high density of irregular, very small pores which are three-dimensionally offset with respect to one another, so that thermal radiation can no longer pass unimpeded through the pores in the susceptor and as a result can no longer cause locally differing heating or warming of the wafer back surface. The effect of the susceptor manifests itself as early as during the preheating phase when the substrate wafer is preheated and exposed to a purge gas, consisting of an inert gas (noble gas or nitrogen) and/or a reducing gas (hydrogen), in order to remove the native oxide layer. The gaseous reaction products which are formed during the dissolution of the oxide layer, like dopant which diffuses out of the substrate wafer, escape through the pores in the susceptor to the back surface of the susceptor, where they are collected by the stream of the purge gas and removed from the reactor.

After the oxide layer has been removed, hydrogen chloride can be added to the purge gas, preferably in order to smooth the front surface of the semiconductor wafer prior to the deposition of the epitaxial layer. To deposit the epitaxial layer, the substrate wafer is brought to the deposition temperature and the front surface of the substrate wafer is brought into contact with a deposition gas, while the back surface of the substrate wafer preferably continues to be exposed to the influence of the purge gas. The deposition gas contains compounds which provide the layer-forming substances by chemical decomposition. These layer-forming substances preferably comprise silicon, germanium, and dopants such as boron. A deposition gas containing trichlorosilane, hydrogen, and diborane, is particularly preferred. After the deposition of the epitaxial layer, the coated semiconductor wafer is cooled, for example in a stream of hydrogen which is passed through the reactor.

The final subject of the invention is a susceptor onto which a semiconductor wafer is placed during the deposition of a layer on a front surface of the semiconductor wafer by chemical vapor deposition (CVD), the susceptor having a gas-permeable structure with a porosity of at least 15%, a density of from 0.5 to 1.5 g/cm$^3$, a pore diameter of less than 0.1 mm and an internal surface area of the pores which is greater than 10,000 cm$^2$/cm$^3$. The susceptor preferably consists of graphite or of graphite fibers having the above-mentioned properties, most preferably of graphite coated with silicon carbide, or graphite fibers coated with silicon carbide, and having the abovementioned properties.

The graphite fibers may be in an ordered (isotropic) structure or in an unordered (anisotropic) structure. If the fibers are coated with silicon carbide, it is preferable for the thickness of the silicon carbide layer to be greater at the surface of the susceptor than in the interior of the susceptor. The required porosity and density of the susceptor material can be set by suitable compacting of fibers or particles during the production of the susceptor. The susceptor is preferably in plate-like form with a pocket for receiving the semiconductor wafer, so that after the semiconductor wafer has been placed on the susceptor, the back surface of the semiconductor wafer faces the base of the susceptor. The base is preferably closed and therefore permeable to gas only on account of the porosity of the susceptor material. However, it is possible for slot-like passages to be present at the outer edge of the pocket, as well as passages in the base of the susceptor for pins used to raise and lower the semiconductor wafer. However, the passages for the pins are closed up by the presence of the pins when the susceptor is in use. The susceptor is preferably used in a single-wafer reactor and is preferably designed to receive semiconductor wafers with a diameter of 150 mm, 200 mm, or 300 mm. It is most preferable for the susceptor to be used in combination with single-wafer reactors produced by ASM and Applied Materials. Thus, virtually all gases which flow through the susceptor do so by gas diffusion, and regularly spaced holes, particularly holes having a size 0.1 mm or more, are preferably absent.

In the text which follows, the invention is compared with the prior art on the basis of an Example. For the comparison, a standard susceptor consisting of graphite coated with silicon carbide was provided with holes of various diameters (Comparative Example). The density of the material was approximately 1.85 g/cm$^3$. A susceptor of the same form was produced from graphite felt coated with silicon carbide (Example). The material of this susceptor had a porosity of approximately 25% and a density of approximately 1.35 g/cm$^3$ as well as a mean pore diameter of 80 µm and an internal surface area of the pores of approx. 10,000 cm$^2$/cm$^3$.

A plurality of substrate wafers made from silicon with p-doping and boron as dopant were provided, in a single-wafer reactor, with a p$^+$-doped (likewise using boron as dopant) epitaxial layer of silicon, in each case using one of the susceptor types described above. The deposition of the epitaxial layer was carried out in accordance with the prior art and included a conventional prebake step. The semiconductor wafers produced were tested for autodoping, halo and nanotopography on the front surface and the back surface. The only significant differences were in the observation of the nanotopography of the back surface. Here, semiconductor wafers which had been coated using a susceptor in accordance with the Comparative Example had nanotopography values which were significantly worse than those achieved with semiconductor wafers produced in accordance with the invention. None of the semiconductor wafers of the Comparative Example achieved nanotopography values of less than 5 nm, based on a measurement window with a surface area of 10·10 mm. As shown in FIGS. 5 to 7, the smaller the diameter of the holes in the susceptor, the greater the deviation in height it was possible to record. By contrast, all the semiconductor wafers of the Example have nanotopography values of less than 5 nm and a haze of less than 5 ppm on the back surface.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A susceptor configured to receive a semiconductor wafer on the surface thereof during the deposition of a layer on a front surface of the semiconductor wafer by chemical vapor deposition (CVD), the susceptor comprising a gas-permeable structure with a porosity of at least 15%, a density of from 0.5 to 1.5 g/cm$^3$, a pore diameter of less than 0.1 mm and an internal surface area of the pores which is greater than 10,000 cm$^2$/cm$^3$, wherein the structure consists essentially of at least one of graphite fibers coated with silicon carbide or graphite particles coated with silicon carbide, and wherein the silicon carbide coating thickness decreases from the surface of the susceptor toward the interior of the susceptor.

2. A process for producing a semiconductor wafer having a layer deposited on a front surface by chemical vapor deposition (CVD) and a polished or etched back surface, the semiconductor wafer, for deposition of the layer, being placed on a susceptor such that the back surface of the semiconductor wafer faces the susceptor, comprising passing gaseous substances through a susceptor of claim 1 by gas diffusion from a region below the back surface of the semiconductor wafer and above the surface of the susceptor.

3. The process of claim 2, wherein following chemical vapor deposition and removal of the semiconductor wafer from the chemical vapor deposition reactor, the back side of the wafer has a nanotopology expressed as PV (=peak to valley) height fluctuation of less than 5 nm, and a halo, expressed as haze, of less than 5 ppm.

4. The process of claim 2, wherein said layer is an epitaxial silicon layer.

5. The process of claim 2, further comprising removing from said susceptor, a semiconductor wafer having a back surface, and a front surface which has been coated by chemical vapor deposition (CVD), wherein the nanotopography of the back surface, expressed as the PV (=peak to valley) height fluctuation, is less than 5 nm, and at the same time the halo of the back surface, expressed as haze, is less than 5 ppm, measured following coating by chemical vapor deposition prior to further refining the surface by polishing or etching after removal from a CVD reactor.

6. A semiconductor wafer having a polished or etched back surface, a front surface which has been coated by chemical vapor deposition (CVD), wherein the nanotopography of the back surface produced by the process of claim 2, expressed as the PV (=peak to valley) height fluctuation, is less than 5 nm, and at the same time the halo of the back surface, expressed as haze, is less than 5 ppm, measured following deposition without any further refinement of the back surface.

7. A semiconductor wafer having a back surface, and a front surface which has been coated by chemical vapor deposition (CVD), wherein the nanotopography of the back surface, expressed as the PV (=peak to valley) height fluctuation, is less than 5 nm, and at the same time the halo of the back surface, expressed as haze, is less than 5 ppm, measured following coating by chemical vapor deposition prior to further refining the surface by polishing or etching after removal from a CVD reactor.

* * * * *